United States Patent [19]

Daubert

[11] Patent Number: 4,585,961

[45] Date of Patent: Apr. 29, 1986

[54] SEMICONDUCTOR INTEGRATED CIRCUIT FOR SQUARING A SIGNAL WITH SUPPRESSION OF THE LINEAR COMPONENT

[75] Inventor: Steven J. Daubert, Morristown, N.J.

[73] Assignee: AT&T Bell Laboratories, Murray Hill, N.J.

[21] Appl. No.: 571,953

[22] Filed: Jan. 19, 1984

[51] Int. Cl.[4] ............................................. G06G 7/20
[52] U.S. Cl. ..................................... 307/491; 307/261; 307/501; 307/497; 328/144; 330/253; 330/257
[58] Field of Search ............... 307/494, 260, 497, 490, 307/261; 328/21, 144, 145, 142, 13, 20, 28; 330/315, 316, 253, 257, 323

[56] References Cited

U.S. PATENT DOCUMENTS 3,710,146 7/1971 Ohsawa .................................. 328/20
4,342,926 8/1982 Whatley ............................... 307/297

OTHER PUBLICATIONS

O. A. Seriki et al., "Direct-Coupled MOS Squaring Circuit," *IEEE Journal of Solid-State Circuits*, vol. SC-14, No. 4, Aug. 1979, pp. 766-768.

*Primary Examiner*—John S. Heyman
*Assistant Examiner*—L. Love
*Attorney, Agent, or Firm*—David I. Caplan

[57] ABSTRACT

An integrated circuit for squaring an original input signal includes a pair of dual-ended difference amplifiers to each of which the input signal is delivered, a pair of dual-to-single-ended converters, each receiving the respective dual-ended output of the respective difference amplifier, and a summing network for summing the squares of the outputs of the dual-to-single-ended converters. One of the dual-to-single-ended converters receives the dual-ended output of the corresponding dual-ended amplifier in opposite (cross-coupled) order from that of the other, whereby the output of the summing network is, except for an additive constant, proportional to the square of the original input signal independently of power supply voltage fluctuations within reasonable limits.

13 Claims, 2 Drawing Figures

SEMICONDUCTOR INTEGRATED CIRCUIT FOR SQUARING A SIGNAL WITH SUPPRESSION OF THE LINEAR COMPONENT

FIELD OF THE INVENTION

This invention relates to semiconductor integrated circuits and more particularly to those for producing an output signal which, except perhaps for an additive constant, is proportional to the square of an input signal and which is substantially independent of ordinary fluctuations in power supply voltage.

BACKGROUND OF THE INVENTION

In telecommunication systems, squaring circuits—i.e., circuits which produce an output which is proportional to the square of an input—are useful in a variety of contexts. Since squaring a sine wave doubles its frequency, a squaring circuit is useful for shifting the frequency of an incoming carrier wave modulated by a signal to a higher frequency range or band. Such shifting is useful, for example, in a modem in which it is desired to process an incoming signal from a transmission channel in which the information is transmitted by phase-shift-keying modulation of the carrier, i.e., by imposing phase shifts upon the carrier wave at regular time intervals (T). The magnitude of each such phase shift can be one of a number of discrete possible amounts, illustratively four, each of these possible amounts of phase shift representing a different possible symbol of information being transmitted. Illustratively, the carrier has a frequency of 1200 Hz, and the phase shifts are imposed every 1/600 second. Thus, illustratively the transmission of information occurs at a symbol frequency or rate of 600 Hz($=1/T$).

In order to demodulate the incoming signal and thus to detect the symbols being transmitted by the channel, it is necessary to detect the magnitude of each of the phase shifts on the carrier. In so doing, it is desirable to have a circuit arrangement for squaring the incoming signal in order to produce a signal with frequency components at the symbol rate ($1/T$) representing the stream of phase shifts; and bandpass filters are then used to remove the carrier wave while preserving the symbol rate information. Illustratively, a bandpass filter centered at the symbol frequency (of $1/T=600$ Hz) can be used, whereby the carrier frequency (1200 Hz) is doubled (to 2400 Hz) and is suppressed by the filter, while the symbol rate information (600 Hz) is passed through the filter. Ordinarily, the carrier frequency is higher than the symbol rate. Therefore, since squaring a carrier wave doubles its frequency (but leaves the symbol rate the same), squaring the incoming signal before filtering is thus useful for doubling the carrier frequency (from 1200 to 2400 Hz) and thus separating the carrier further in frequency from the symbol rate (600 Hz). A narrow bandpass filter (i.e., with a quality Q of typically about 10 or more) centered at the symbol rate will then be able to remove more nearly completely the carrier wave component, thus doubled (or more) in frequency, from the symbol rate components, since such a bandpass filter in general more completely removes components whose frequencies are more distant from the center frequency of the pass band. After the original incoming signal (carrier with phase shifts) has thus been squared and filtered, the remaining symbol rate components are relatively free from any carrier and thus are available for further processing.

In the foregoing squaring of the incoming signal, it is important that the squaring be pure and hence not yield any significant amount of first harmonic (fundamental) component (at 1200 Hz); otherwise the desired frequency separation of symbol information from the carrier will not be as complete as desired, and hence the symbol information emanating from the bandpass filter will be undesirably contaminated with the carrier.

To clarify the problem, it is known that a squaring circuit's principle of operation is governed by the trigonometric identity:

$$2(\cos \omega t)^2 = 1 + \cos 2\omega t \quad (1)$$

where $\omega$ is the radial frequency, i.e., $$\omega = 2\pi f$$

where f is the cycle frequency. Thus, squaring a carrier signal of frequency f produces a d.c. component and a second harmonic component ($\cos 2\omega t$), but no first harmonic. On the other hand, a trigonometric identity such as:

$$4(\cos \omega t)^3 = 2 \cos \omega t + \cos 3\omega t \quad (2)$$

shows that cubing the input (i.e., raising the input to the third power) results in an undesired first harmonic (as well as third harmonic) component in the output. Similarly, any odd integral power component in the output causes the output to contain undesired first harmonic. Thus a desirable squaring circuit does not produce any substantial amount of linear component, or any substantial amount of odd integral power components, in the output relative to the input.

In a paper by O. A. Seriki and R. W. Newcomb entitled "Direct-Coupled MOS Squaring Circuit," published in *IEEE Journal of Solid-State Circuits*, Vol. SC-14, pp. 766–768 (1979), a squaring circuit is described using MOS (metal oxide semiconductor) transistor technology. That circuit, however, successfully, removes the undesired linear term only if the voltage supplies ($V_{DD}$ and $V_{SS}$) for the transistors in the circuit are carefully controlled and adjusted during operation so that ($V_{DD}+V_{SS}$) is essentially zero. For example, $V_{DD}=+4.0$ volts and $V_{SS}=-4.0$ volts. But, such control of voltage supplies would necessitate the addition of undesirably complex control circuitry, because in the present state of the art the ordinary voltage source fluctuates by as much as 5 percent during operation, and such voltage fluctuations would produce an undesirable corresponding amount, as much as about 100 percent, first harmonic in the output of that squaring circuit.

Therefore, it would be desirable to have a squaring circuit which substantially removes first harmonic (i.e., the linear component) even in the presence of voltage supply fluctuations of as much as about ±10 percent, i.e., well above the amount of ordinary fluctuations. By "substantially removes" it is meant that less than about 5 percent first harmonic amplitude relative to second harmonic is present in the output.

SUMMARY OF THE INVENTION

In an integrated circuit, a squaring circuit arrangement comprises a pair of identical dual-ended linear amplifiers, each of the amplifiers being connected for receiving an incoming signal and each having separate coupling means for feeding a different one of a pair of identical dual-to-single-ended linear converters, and a nonlinear/summing device for nonlinearly transforming and summing the single-ended outputs of the converters, in which the coupling means of one of the dual-ended amplifiers cross-couple a pair of output terminals of the one amplifier to a pair of input terminals of the corresponding converter. By "nonlinear/summing device" is meant a device that nonlinearly transforms each of the single-ended outputs—say of amplitudes A and B, respectively—of the converters in "substantially" the same way and adds the results together. For example, a "squarer/summer" device is one which squares each of these single-ended outputs of amplitudes A and B, and adds the results together to produce an output equal to $\beta(A^2+B^2)$, where $\beta$ is a constant. In general, a nonlinear/summing device having a nonlinear transformation function F produces an output which can be represented as $\beta[F(A)+F(B)]$.

In a specific embodiment of the invention, each amplifier is a difference amplifier comprising a pair of MOS inverters mutually connected in parallel. Each amplifier is supplied by the same constant current source. One of the MOS inverters receives the incoming signal, and the other receives a steady reference voltage (such as ground). Each dual-to-single-ended converter comprises a separate pair of input MOS transistors and a separate pair of output MOS transistors. Each input MOS transistor is connected in series with a different one of the output transistors, the gate terminals of the output transistors in each converter being connected together and to the same one of the input transistors. Finally, the squarer/summer network comprises a pair of input MOS transistors connected in parallel with each other and in series with an MOS transistor load, the gate terminal of one of these input transistors being connected to the output terminal of one of the dual-to-single-ended converters and the gate terminal of the other of these input transistors being connected to the output terminal of the other of the dual-to-single-ended converters. By "MOS transistor" is meant an insulated gate field effect transistor having a metal oxide (or other insulator) semiconductor structure, as known in the art.

In this way, as much as about a ±10 percent fluctuation in the bias voltage supply can be tolerated without introducing any more than 5 percent undesirable first harmonic amplitude into the output of the squaring circuit.

BRIEF DESCRIPTION OF THE DRAWING

This invention together with its features, advantages, and characteristics may be better understood from the following detailed description when read in conjunction with the drawing in which.

DETAILED DESCRIPTION

Figure 1:
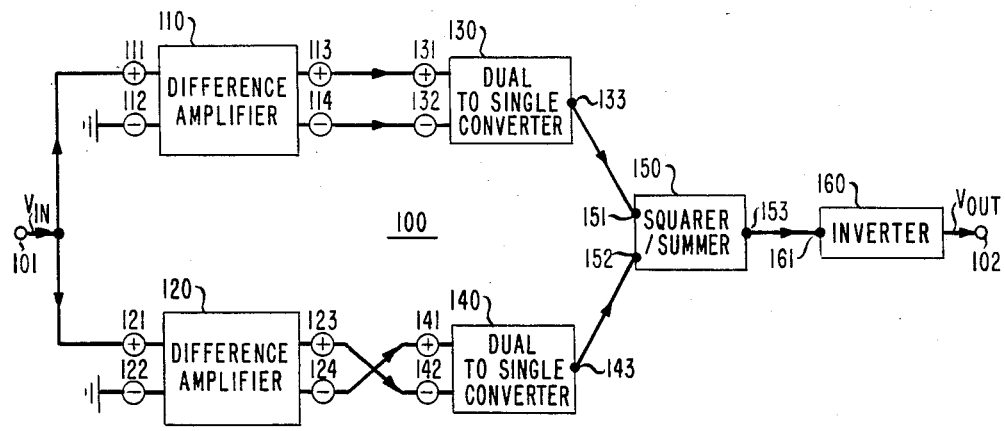
FIG. 1 is a block function diagram illustrating an integrated circuit for squaring an incoming signal, in accordance with the invention.

As shown in FIG. 1, an integrated circuit arrangement 100 for squaring an incoming input signal $V_{IN}$ receives the incoming signal $V_{IN}$ at a circuit input terminal 101 and delivers an output $V_{OUT}$ at a circuit output terminal 102. By means of interconnecting wires, the input signal $V_{IN}$ is delivered from the input terminal 101 to positive input terminals 111 and 121, respectively, of first and second difference amplifiers 110 and 120, respectively; whereas ground potential is delivered to negative input terminals 112 and 122, respectively, of these amplifiers. By "ground" is meant a steady voltage reference with respect to which the incoming signal varies with time.

The first amplifier 110 is constructed identically to the second amplifier 120, and both amplifiers are advantageously linear in their outputs versus inputs. Each of these amplifiers is dual-ended at both input and output ends; that is, each amplifier has two input terminals and two output terminals, as described more fully below. A positive output terminal 113 of the first amplifier 110 is connected to a positive input terminal 131 of a first dual-to-single-ended converter 130, and a negative terminal 114 of the first amplifier 110 is connected to a negative terminal 132 of the first converter 130. On the other hand, for cross-coupling the second amplifier 120 to the second dual-to-single-ended converter 140, a positive output terminal 123 of the second amplifier 120 is connected to a negative input terminal 142 of a second dual-to-single-ended converter 140, and a negative output terminal 124 of the second amplifier 120 is connected to a positive input terminal 141 of the second converter 140. The first and second converters are also constructed to be identical.

An output terminal 133 of the first converter 130 is connected to an input terminal 151 of a squarer/summer 150, and an output terminal 143 of the second converter 140 is connected to another terminal of the squarer/summer 150. An output terminal 153 delivers output of the squarer/summer 150 to an input terminal 161 of an inverter 160, and the inverter delivers to the output terminal 102 the desired output signal $V_{OUT}$ representative of the square of the input signal $V_{IN}$. It should be noted that $V_{OUT}$ may contain components of higher even-integer powers (and hence even harmonics) of the input but substantially no linear or other odd-integer power (odd harmonic) components. The inverter 160 can be omitted, and the output of the squarer/summer 150 is then the desired output.

During operation, because of the linearity of the amplifier 110 and 120, a positive-going increment v in the input signal $V_{IN}$ produced corresponding positive-going increments in voltage $\alpha v$ on the positive output terminals 113 and 123 of the amplifiers 110 and 120, respectively, and corresponding negative-going increments ($-\alpha v$) on the negative output terminals 114 and 124, where $\alpha$ is a constant (independent of v). In response, the first converter 130 develops a positive-going increment on its output terminal 133 owing to the positive or direct (positive output terminal 113 to positive input terminal 131) coupling between the first amplifier 110 and the first converter 130, whereas the second converter 140 develops a negative-going increment on its output terminal 143, owing to the negative or cross-coupling (positive output terminal 123 to negative output terminal 142) between the second amplifier 120 and the second converter 140.

The squarer/summer 150 operates by squaring the signals on its input terminals 151 and 152, and then by adding these squares. For example, denoting the voltage developed on the output terminal 133 of the first converter 130 by ($V+\alpha v$), where V is an offset and v is the increment in the input signal, then the voltage on the output terminal 143 of the second converter 140 will be (V−av) because of the linearity of response of both first and second amplifiers, the identity of construction of the first amplifier relative to the second amplifier, the linearity of both the first and second converters, and the identity of construction of the first converter relative to the second converter. Squaring and adding these voltages by the squarer/summer 150 yields $$(V+av)^2 + (V-av)^2 = 2V^2 + 2a^2v^2;$$

that is, there is no linear term in the increment v.

More generally, the squarer/summer 150 can be any nonlinear/summer device element that produces an output which is equal to $F(av) + F(-av)$, i.e., the sum of the nonlinear function $F(av)$ of the increment $av$ and the nonlinear function $F(-av)$ of the negative increment $-av$. Expressed as a Taylor series:

$$\begin{aligned} F(av) + F(-av) = & \\ \{A + aav + b(av)^2 + c(av)^3 + d(av)^4 + \ldots\} + & \\ \{A + a(-av) + b(-av)^2 + c(-av)^3 + d(-av)^4 + \ldots\} = & \\ 2A + 2aa^2v^2 + 2ca^4v^4, & \end{aligned} \quad (3)$$

where A is the contribution of each of the outputs when the increment v=o, and a,b,c, and d are the coefficients of the power series expansion of each of the inputs being processed by the device element. The significant point herein is the cancellation of the linear $aav$ and $aa(-v)$, and of the third-order terms, $c(av)^3$ and $c(-av)^3$, as well as the cancellation of all other higher order odd-integer power terms.

Figure 2:
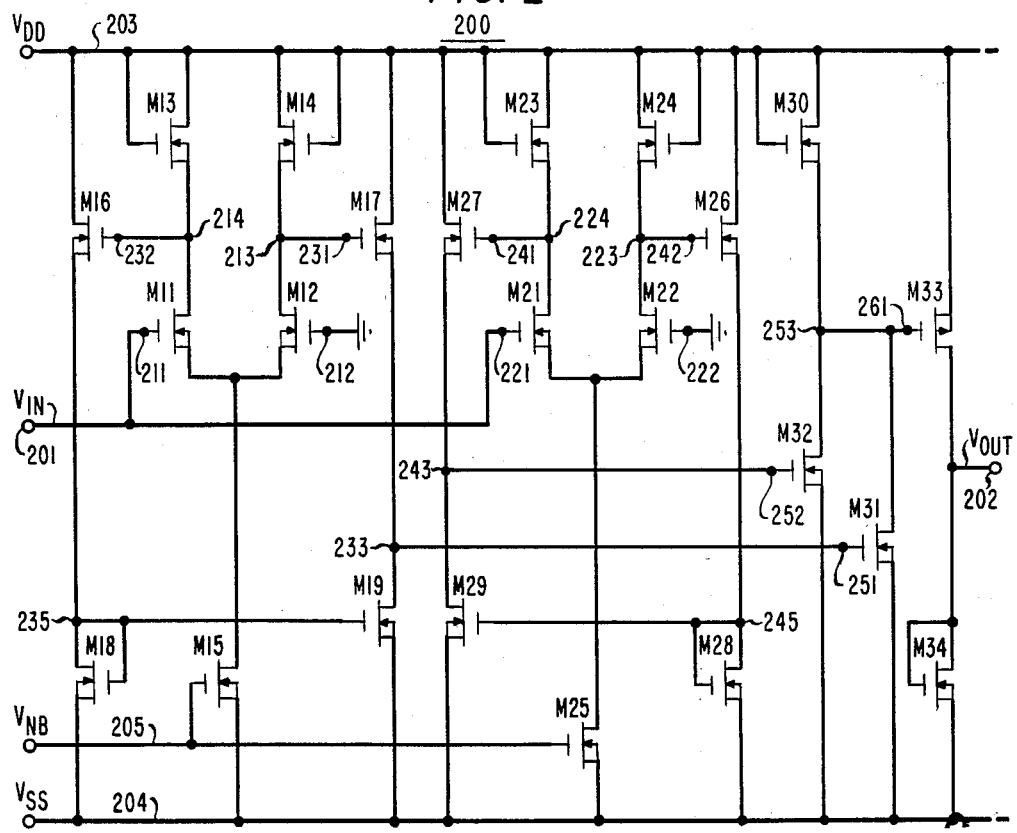
FIG. 2 is a schematic diagram of an integrated circuit for squaring an incoming signal, in accordance with a specific embodiment of the invention.

FIG. 2 is a circuit schematic of a specific circuit 200 embodying the integrated circuit 100 described above. Elements of FIG. 2 which are equivalent to those of FIG. 1 are denoted by the same reference numerals plus one hundred. All transistors in FIG. 2 advantageously are N-channel enhancement mode MOS, except for M33 which is P-channel enhancement mode MOS. The circuit 200 has an input terminal 201 and an output terminal 202.

The first difference amplifier 110 (FIG. 1) is formed in the circuit 200 (FIG. 2) driver transistors M11 and M12, together with load transistors M13 and M14, as well as a current source transistor M15. Advantageously, the channel width-to-length ratios (W/L), and hence the transconductances, of the drivers M11 and M12 are selected to be mutually equal to that of the loads M13 and M14, in order to achieve unity gain of the difference amplifier; but this selection is not essential. The driver M11 is connected in series with the load M13 to form a first branch of the difference amplifier 210, whereas the driver M12 is connected in series with the load M14 to form a second branch of the first amplifier in parallel with the first branch. These first and second branches are connected in series with the current source transistor M15 which provides a constant current to the branches. The gate terminal of the driver M11 is connected to the input terminal 201; the gate of the driver M12 is connected to ground (i.e., substrate ground). The gate and drain terminals of the load transistors M13 and M14 are connected to a first power line 203 which is maintained during operation at a steady voltage $V_{DD}$ of typically about +5.0 volts, i.e., about 5.0 volts above ground potential. The source terminal of the current source transistor M15 is connected to a second power line 204 maintained during operation at a steady voltage $V_{SS}$ of typically about −5.0 volts, i.e., about 5.0 volts below ground potential. The gate terminal of this current source transistor M15 is connected to a bias voltage line 205 which is maintained during operation at a bias voltage $V_{NB}$ suitable for causing the N-channel MOS current source transistor M15 to deliver a constant current. For example, this bias voltage $V_{NB}$ can be supplied by the bias current reference circuit described in U.S. Pat. No. 4,342,926 issued to Whatley on Aug. 3, 1982, entitled "Bias Current Reference Circuit." This bias voltage $V_{NB}$ can also be simultaneously used as a reference for other elements of a signal processor, such as a modem, of which the squaring operation is only a part.

The gate terminal 211 of driver M11 serves as a positive input terminal of the first difference amplifier, and the gate terminal 212 of driver M12 is connected to (substrate) ground. The nodes 213 and 214 serve as positive and negative output terminals, respectively, of this first amplifier.

The second difference amplifier 120 (FIG. 1) is formed in the circuit 200 (FIG. 2) formed by drivers M21 and M22, loads M23 and M24, and current source M25. This second amplifier is identical to the first difference amplifier, and corresponding transistors of this second amplifier have been denoted by the same numerals as those of the first amplifier plus ten.

By locating the transistors of the first and second difference amplifiers in relatively close material proximity on the surface of the same semiconductor body, in which the circuit 200 is integrated, the desired identity of operating characteristics of the the amplifiers can be assured in the face of variations in temperature and semiconductor processing parameters across the surface of the body. Similarly, the identity of the two converters can be achieved.

The first dual-to-single-ended converter 130 (FIG. 1) is formed in the circuit 200 (FIG. 2) by transistors M16, M17, M18, and M19. Transistors M16 and M17 serve as drivers of the loads formed by transistors M18 and M19, respectively. The gate terminal of M18 is connected to its drain terminal; the gate terminal of M19 is connected to the gate terminal of M18. The gate terminal 232 of M16 is connected to the negative output terminal 214 of the first difference amplifier, and the gate terminal 231 is connected to the positive output terminal 213 thereof.

During operation, a positive-going incremental signal v in the input $V_{IN}$ causes transistor M11 to become more conducting and to draw more current from the source M15; whereby the current in the first branch of the first amplifier increases, and in the second branch decreases. Accordingly, the voltage at terminal 214, and hence at terminal 232, decreases away from $V_{DD}$; whereas the voltage at the node 213, and hence also at the node 231, increases toward $V_{DD}$. In turn, the resistance of M16 increases; whereby the voltage at terminal 235 between M16 and M18 decreases (toward $V_{SS}$), and hence the resistance of M19 increases. At the same time, the increased voltage at terminal 231 causes the resistance of M17 to decrease. As a result of this decrease in resistance of M17 and the increase in resistance of M16, the voltage at terminal 233 increases. Thus, a positive-going input signal $V_{IN}$ produces a positive-going response at terminal 233, serving as the output terminal of the first dual-to-single-ended converter.

Similarly, the second dual-to-single-ended converter 140 (FIG. 1) is formed in the circuit 200 (FIG. 2) by transistors M26, M27, M28 and M29, respectively. The positive output terminal 223 of the second difference amplifier is located between M22 and M24, and the negative output terminal 224 of the second difference amplifier is located between M21 and M23. Note, however, that terminals 223 and 224 are connected to the gate terminals 242 and 241, respectively, of M26 and M27, respectively, instead of vice versa; and also note that the output terminal 243 of this second converter is located between M27 and M29, rather than between M26 and M28, in order to provide the cross-coupling of the second difference amplifier to the second dual-to-single ended converter. During operation, a positive-going input signal $V_{IN}$ produces a negative-going signal at terminal 241 (and a positive-going signal at terminal 242). Thus, a positive-going input signal $V_{IN}$ produces a corresponding negative-going signal at terminal 243, serving as the output terminal of the second dual-to-single-ended converter.

The squarer/summer 150 (FIG. 1) is formed in the circuit 200 (FIG. 2) by transistors M30, M31, and M32. The transistors M31 and M32 serve as drivers; the transistor M30, as a load, with its gate terminal connected to its drain terminal. The output terminals 233 and 243 of the first and second converters, respectively, are connected to the input terminals 251 and 252, respectively, of the squarer/summer 150, i.e., to the gate terminals of drivers M31 and M32, respectively. The output of this squarer/summer is developed at terminal 253. Finally, the inverter 160 (FIG. 1) is formed in the circuit 200 (FIG. 2) by transistors M33 and M34. The gate terminal of M33 is connected to the output terminal 253 of the squarer/summer; the gate of M34 is connected to its drain. A node between M33 and M34 forms an output terminal of the inverter and hence of the circuit 200. Transistors M31 and M32 are advantageously biased in their nonlinear (saturation) operating regions, that is, the voltages at their (gate) nodes 251 and 252 should be maintained during operation at values which are sufficiently small (above $V_{SS}$) so that they do not exceed the drain-source drop plus threshold voltage of the respective transistors M31 and M32. Ordinarily, the nonlinear (saturation) regions of M31 and M32 yield currents which are quadratic in the respective gate voltages less threshold voltages, as well known in the art. Proper choice of the channel width-to-length ratios of the various transistors which influence the voltages on these nodes 251 and 252 can ensure this nonlinearity of operation of these transistors M31 and M32.

During operation, a positive-going increment v in the input signal $V_{IN}$ produces a positive-going response at terminal 233 and a negative-going response at terminal 243. Thus, the voltage at the gate terminal 251 of M31 goes up by an increment v, and the voltage at the gate terminal 252 of M32 goes down by an equal (but opposite) increment, $-v$, so long as the constructions of the second amplifier and the second converter are identical with those of the first amplifier and of the first converter, respectively (except for the above-mentioned cross coupling). In turn, the resistance of M31 decreases; that of M32 increases. To the first order approximation in v, therefore, the voltage at the output terminal 253 of the squarer/summer does not change; but to the second order, it does, because of the nonlinearity of the operating regions of M31 and M32. Thus, the gate terminal 261 of the driver M33 of the inverter receives response signal of order $v^2$, and the inverter (which is optional) serves to amplify this response. Conversely, a negative-going increment $(-v)$ of input signal $V_{IN}$ produces a negative-going voltage response at terminal 251 and a positive-going response at terminal 252, but produces the same second-order response at terminal 253 for the same increment v in $V_{IN}$ regardless of the polarity (sign) of the increment.

For the sake of illustration, typical values of channel width-to-length ratios (W/L) for the transistors are: M11=M12=M21=M22=M13=M14=M23=M24=-10/38, M16=M17=M26=M27=8/97, M30=10/65, M31=M32=17/60, M18=M19=M28=M29=10/13, M15=M25=40/8, M33=22/15, M34=10/42.

Although the invention has been described in terms of a specific embodiment, various modifications can be made without departing from the scope of the invention.

What is claimed is:

1. In an integrated circuit, a circuit arrangement for producing an output signal which is a prescribed nonlinear function of an incoming signal comprising a pair of identical dual-ended linear amplifiers, each of the amplifiers connected for receiving the incoming signal and each of the amplifiers connected for delivering its output to a different one of a pair of identical dual-to-single-ended linear converters, and a nonlinear/summing device for nonlinearly transforming and summing the single-ended outputs of the converters to produce the output signal, in which coupling means of one of the dual-ended amplifiers cross-couple a pair of output terminals of the one amplifier to a pair of input terminals of the corresponding converter.

2. An integrated circuit including means for squaring an incoming signal comprising:
   (a) first and second identical dual-ended amplifiers, each of the amplifiers for receiving as input the incoming signal and each for developing a respective dual-ended output at a separate pair of amplifier output terminals thereof;
   (b) first and second identical dual-to-single-ended converters each having a separate single-ended output terminal, the first converter having a first pair of input terminals thereof coupled to the pair of output terminals of the first dual-ended amplifier, the second converter having a second pair of input terminals thereof of cross-coupled to the pair of output terminals of the second dual-ended amplifier; and
   (c) a summer/squarer network connected for receiving, squaring, and summing the signals from the single-ended output terminals of the first and second converters.

3. The circuit of claim 2 in which each amplifier is a difference amplifier comprising a separate pair of MOS inverters connected mutually in parallel, each such amplifier connected for being supplied by a source of the same constant current, one of the inverters in each of such amplifiers for receiving as input the incoming signal and the other of the inverters in each of such amplifiers for receiving as input a reference voltage.

4. The circuit of claim 3 in which each of the inverters has an input MOS transistor connected in series with a load.

5. The circuit of claim 4 in which each load is an MOS transistor having the same transconductance as the input MOS transistor.

6. The circuit of claim 3 in which the reference voltage is ground potential.

7. The circuit of claim 5 in which each converter comprises a separate pair of input MOS transistors and a separate pair of output MOS transistors, each such input transistor of each converter being connected in series with a different one of the output transistors of the converter, both output transistors of each converter having gate terminals which are connected together and to one of the input transistors of the converter.

8. The circuit of claim 4 in which each converter comprises a separate pair of input MOS transistors and a separate pair of output MOS transistors, each such input transistor of each converter being connected in series with a different one of the output transistors of the converter, both output transistors of each converter having gate terminals which are connected together and to one of the input transistors of the converter.

9. The circuit of claim 3 in which each converter comprises a separate pair of input MOS transistors and a separate pair of output MOS transistors, each such input transistor of each converter being connected in series into a different one of the output transistors of the converter, both output transistors of each converter having gate terminals which are connected together and to one of the input transistors of the converter.

10. An integrated squarer circuit comprising:
(a) first and second dual-ended amplifiers each having a pair of identical parallel branches connected together in series with a separate identical bias current source, each of the branches having a separate input MOS transistor connected in series with a separate load MOS transistor, the input transistor in one branch of each of the first and second amplifiers being connected for receiving a signal to be squared by the circuit, the input transistor in the other branch of each of the first and second amplifiers being connected for receiving a reference voltage, the first and second amplifiers having a separate negative output node located between the input and output transistors of the one branch of the respective amplifier and having a separate positive output node located between the input and output transistors of the other branch of the respective amplifiers;
(b) first and second dual-to-single-ended converters, each having a separate pair of parallel branches, each branch having a separate input MOS transistor connected in series with a separate output MOS transistor, the input transistors of one branch of each of the first and second converters, respectively, having a gate terminal connected to the negative output node of the first and second amplifiers, respectively, the input transistors of the other branches of the first and second converters, respectively, having a gate terminal connected to the positive output node of the first and second amplifiers, respectively, the output transistors of the one branch of the first converter having a gate terminal connected to its source terminal and to a gate terminal of the output transistor of the other branch of the first converter, and the output transistors of the other branch of the second converter having a gate terminal connected to its source terminal and to a gate terminal of the one branch of the second converter, the first converter having an output node located between the input and output transistors of the other branch thereof, the second converter having an output node located between the input and output transistors of the one branch thereof; and (c) a summer/squarer network connected for receiving, squaring, and summing the signals developed at the output node of the first and second converters.

11. The circuit of claim 10 in which the summer/squarer network comprises a pair of input MOS transistors mutually connected in parallel and connected together in series with a load for biasing the input transistors of the network in a nonlinear region, one of the input transistors thereof having a gate terminal connected to the output node of the first converter and the other of the input transistors thereof having a gate terminal connected to the output node of the second converter, whereby during operation the square of the signal is developed at a node located between the input transistors and the load of the converter.

12. The circuit of claim 11 in which the summer/squarer network consists of a pair of input MOS transistors mutually connected in parallel and connected together in series with a load for biasing the input transistors of the network in a nonlinear region, one of the input transistors thereof having a gate terminal connected to the output node of the first converter and the other of the input transistors thereof having a gate terminal connected to the output node of the second converter, whereby during operation the square of the signal is developed at a node located between the input transistors and the load of the converter.

13. The circuit of claim 10 in which the transconductances of the input transistor of the amplifier are equal to the transconductances of the output transistors of the amplifiers.

* * * * *